US008076219B2

(12) United States Patent
Radouane

(10) Patent No.: US 8,076,219 B2
(45) Date of Patent: Dec. 13, 2011

(54) REDUCTION OF WATERMARKS IN HF TREATMENTS OF SEMICONDUCTING SUBSTRATES

(75) Inventor: Khalid Radouane, Carrieres sur Seine (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/746,132

(22) PCT Filed: Nov. 18, 2008

(86) PCT No.: PCT/EP2008/065771
§ 371 (c)(1),
(2), (4) Date: Jun. 3, 2010

(87) PCT Pub. No.: WO2009/086983
PCT Pub. Date: Jul. 16, 2009

(65) Prior Publication Data
US 2010/0255659 A1    Oct. 7, 2010

(30) Foreign Application Priority Data
Jan. 4, 2008   (EP) ................................ 08305001

(51) Int. Cl.
*H01L 21/20* (2006.01)
(52) U.S. Cl. ........... 438/478; 257/E21.09; 257/E21.224
(58) Field of Classification Search .............. 438/478; 257/E21.09, E21.224
See application file for complete search history.

(56) References Cited

U.S. PATENT DOCUMENTS

| 5,051,134 A | 9/1991 | Schnegg et al. ........... 134/3 |
| 5,374,564 A | 12/1994 | Bruel ................ 437/24 |
| 5,932,022 A | 8/1999 | Linn et al. ................. 134/2 |
| 6,235,122 B1 * | 5/2001 | Zhang et al. ............. 134/2 |
| 6,346,505 B1 | 2/2002 | Morita et al. ............. 510/175 |
| 6,348,157 B1 | 2/2002 | Ohmi et al. .............. 210/760 |
| 6,429,144 B1 | 8/2002 | Vines et al. .............. 438/745 |
| 2002/0052096 A1 * | 5/2002 | Zhang et al. ............. 438/487 |

(Continued)

FOREIGN PATENT DOCUMENTS

| EP | 0 936 268 | 8/1999 |
| WO | WO 2007/024515 | 3/2007 |
| WO | WO 2007/140409 | 12/2007 |

OTHER PUBLICATIONS

International Search Report, PCT/EP2008/065771, mailed Mar. 3, 2009.
Namba et al., "Insights Into Watermark Formation and Control", Solid State Phenomena, vols. 103-104, pp. 83-86 (2005).
European Search Report, EP08305001, dated Apr. 3, 2008.
Jae-Inh Song et al., "Advanced Front-End-Of-The Line Cleaning", Semiconductor Fabtech, pp. 1-5 (1996).

(Continued)

*Primary Examiner* — Alexander Ghyka
*Assistant Examiner* — Stanetta Isaac
(74) *Attorney, Agent, or Firm* — Winston & Strawn LLP

(57) ABSTRACT

A process for reducing or suppressing the appearance of watermarks in a hydrophobic surface of a semiconductor substrate prepared as a base substrate for epitaxial growth. The process includes cleaning the hydrophobic surface of the semiconductor substrate with an aqueous solution containing hydrofluoric acid (HF) and an additional acid having a pKa of less than 3, preferably hydrochloric acid (HCl), wherein the additional acid is present in the solution at a concentration by weight that is less than that of the HF; and final rinsing the cleaned hydrophobic surface of the semiconductor substrate with deionised water while subjecting the hydrophobic surface of the semiconductor substrate to megasonic waves for a time sufficient to reduce or suppress watermarks that could otherwise occur on the hydrophobic surface if the megasonic waves were not applied.

20 Claims, 1 Drawing Sheet

Without Megasonic waves

U.S. PATENT DOCUMENTS

| | | | |
|---|---|---|---|
| 2005/0139231 A1 | 6/2005 | Abadie et al. | 134/2 |
| 2006/0234516 A1 | 10/2006 | Hong et al. | 438/765 |
| 2007/0178706 A1 | 8/2007 | Kim et al. | 438/749 |
| 2007/0256705 A1 | 11/2007 | Abbadie et al. | 134/3 |
| 2008/0169007 A1 | 7/2008 | Kashkoush et al. | 134/28 |
| 2009/0042400 A1 | 2/2009 | Pagliaro, Jr. | 437/745 |

OTHER PUBLICATIONS

M.M. Heyns et al., "Cost-Effective Cleaning and High-Quality Thin Gate Oxides", IBM J. Res. Develop. vol. 43, No. 3, pp. 339-350 (1999).

A.J. Auberton-Hervé et al, "Why Can Smart Cut® Change the Future of Microelectronics?", International. Journal of High Speed Electronics and Systems, vol. 10, No. 1, pp. 131-146 (2000).

H. Okumura et al., XP002474819, "Comparison of Conventional Surface Cleaning Methods For Si Molecular Beam Epitaxy", Journal of the Electrochemical Society, vol. 144, No. 11, pp. 3765-3768, (1997).

S. Verhaverbeke et al., XP008089904, "Isothermal epi-Si deposition at 800° C", Electrochemical Society Proceedings, vol. 99-36, pp. 445-451 (2000).

H. B. Brugge et al., XP002474818, "Optimization Of Pre-Gate Clean Technology For A 0.35µm Dual-Oxide/Dual-Voltage CMOS Process", Proceedings Of The SPIE- The International Society For Optical Engineering, vol. 3212, pp. 52-60, (1997).

J. P. Chang et al., XP008102746. "The Effect Of Dilute Cleaning And Rinsing Chemistries On Transition Metal Removal And Si Surface Microroughness" Electrochemical Society Proceedings, vol. 99-36, pp. 17-24 (2000).

Heui-Gyun Ahn et al., XP010370039, "Identification And Removal Of Defects On Silicon Wafer Processed With A Rinse With/Without Megasonics In DI Water", IEEE, pp. 459-462 (1999).

Written Opinion, Singapore Application No. 201003322-3 dated Jun. 2, 2011.

\* cited by examiner

Without Megasonic waves

With Megasonic waves

REDUCTION OF WATERMARKS IN HF TREATMENTS OF SEMICONDUCTING SUBSTRATES

This application is a 371 filing of International Patent Application PCT/EP2008/065771 filed Nov. 18, 2008.

INTRODUCTION

In the fields of microelectronics, micromechanics, integrated optics and integrated electronics, there is a need to prepare clean surfaces of semiconducting substrates such as silicon and silicon-germanium prior to the preparation of an overlying layer by epitaxy.

In the cleaning procedure prior to epitaxy, the use of hydrofluoric acid is known in the treatment process called "HF-last". Hydrofluoric acid removes surface oxide from substrates such as silicon and silicon-germanium and leaves the surface in a hydrophobic state. By contrast, steps in some cleaning processes of silicon and silicon-germanium layers involve the application of oxidizing agents such as hydrogen peroxide or ozone and increase the amount of surface oxide, thus creating a more hydrophilic surface.

The present invention proposes an improved process of cleaning using hydrofluoric acid, in such a way that the surface quality prior to epitaxy may be improved, and in particular the occurrence of defects known as "watermarks" may be minimized. The latter are constituted by a series of surface defects (resulting from solution-surface dissolution and/or (re)precipitation) which are arranged in a straight line having as its origin (even if not directly visible) the centre of the semiconductor wafer surface being cleaned (or a point near to this geometric centre). This type of pattern arises on account of the wafer rotation procedures employed during rinsing and drying steps, involving turning about an axis of rotation at or near to the geometric centre of the wafer, leading to streaking patterns.

In addition, there is a need in the art to provide cleaning chemistries that are effective in a "single wafer" process, as it is observed that "single wafer" processes give rise to particular problems of watermark formation. In the handling of semiconductor wafers, a distinction is made between "single wafer" devices and "wet bench" devices. In "single wafer" devices (like SEZ304 from the SEZ company), a single substrate, presented horizontally, is etched at one time, by application of a chemical solution onto the individual substrate. By contrast, in "wet bench" devices (like PRETECH equipments), a batch of for example 25 or 50 substrates is dipped in a bath of chemical etching solution. "Single wafer" devices can in principle offer a number of advantages such as the fact that fresh solutions are being applied to each wafer, and improved uniformity on the wafer surface can be obtained, and better homogeneity from one wafer to another, as compared to "wet bench" devices.

BACKGROUND OF THE INVENTION

Although not limited to a specific area of semiconductor technology, the present invention is of particular relevance in the manufacture of structures of the sSOI type (strained silicon on insulator) using the Smart Cut® technology to obtain the desired hetero structure. Examples of the implementation of Smart Cut® technology are described in, for example, U.S. Pat. No. 5,374,564 or A. J. Auberton-Hervé et al. intitulé "Why can Smart-Cut Change the Future of Microelectronics?", Int. Journal of High Speed Electronics and Systems, Vol. 10, No. 1, 2000, p. 131-146.

This technology involves the following steps:

a) bombardment of one face of a donor substrate (for example, silicon) with light ions such as those of hydrogen or helium in order to implant these ions in sufficient amounts in the substrate, the implant zone generating a zone of weakness through formation of microcavities or platelets, b) bonding of this face of donor substrate with a receiver substrate, and c) cleavage/fracture of the donor substrate about the implanted zone enabling the transfer to the receiver substrate of that part of the substrate situated between the surface subjected to ion implantation and the zone of weakness generated at a certain depth via the implantation. A silicon-on-insulator (SOI) structure can thus be obtained.

In a typical application of Smart Cut® technology, this may involve first of all the preparation of a donor substrate comprising a support substrate of silicon upon which a buffer layer of SiGe (silicon-germanium) is prepared, and on top of this a relaxed layer of SiGe. The buffer layer has a very low level of germanium at the interface with the support substrate and, at the other interface, a level of germanium close or equivalent to that of the germanium in the relaxed layer.

Upon the relaxed SiGe layer, epitaxy can be used to form a layer of strained silicon. Strained silicon, where silicon is grown on a Si—Ge surface, and is obliged to have more broadly spaced atoms than in pure silicon, shows higher charge carrier mobility and therefore increased transistor operation speed.

The assembly of layers comprising the three mentioned (sSI/SiGe/Si) is used as a donor substrate in the Smart Cut® technology. This is then bonded to a suitable acceptor substrate, and the original silicon and SiGe layers of the donor substrate are removed in the preparation of the final wafer, comprising strained silicon on a receiver substrate.

In this system, the concentration of germanium in the relaxed layer may vary according to the degree of strain required in the strained silicon layer.

Before the growth of the strained silicon layer by epitaxy, cleaning of the SiGe surface by the HF-last procedure is commonly used. The HF-last procedure removes oxide and makes the surface hydrophobic. A polishing of the relaxed SiGe layer before application of the HF-last is commonly carried out. The strained silicon layer is in general rather thin, having a thickness of the order of 200 Å. It is therefore important to be able to control the quality of this layer as much as possible. After removal of the SiGe relaxed layer during preparation of a final sSOI substrate, the contact surface between the strained silicon grown by epitaxy and the original SiGe will once again be exposed, and if there are defects, these will be exposed in the final sSOI product.

It may also be noted that the sSOI surface here may be the subject of further epitaxy ("re-epitaxy") after transfer onto the receiver substrate, but this may not suffice to annul the consequences of the original surface defects.

It is in this context that the HF-last treatment of the SiGe layer before epitaxy is important. It is known that this procedure may give rise to surface defects known as "watermarks". Various causes are believed to be behind the appearance of watermarks, such as the presence of oxygen dissolved in the deionised water used for rinsing, or hydrofluoric acid vapor present in the vicinity of the wafer during drying thereof. These factors are discussed in the article by Namba et al., "Insights Into Watermark Formation And Control", *Solid State Phenomena*, Vols. 103-104 (2005) pp. 83-86.

It is known at present to carry out, after the HF-last treatment, a thermal treatment at high temperature (about 800° C.) using an $H_2$ bake to remove remaining oxygen. This treatment, requiring a certain amount of energy consumption, does not however completely solve the problem of watermarks.

US 2007/0256705 discloses wet cleaning of a semiconductor surface involving successive treatments with HF solutions and then solutions containing strong oxidizing agents. The use of hydrochloric acid (HCl) in the presence of HF is taught to reduce roughening of the surface, or the tendency to form pitting, due to oxidation of a silicon surface in the presence of noble metals. Exemplified relative concentrations are 0.2% HF and 1.0% HCl. The use of megasonic waves during the phases of substrate treatment involving oxidizing treatments is disclosed by US 2007/0256705, for example during treatment with an ozone-containing solution.

U.S. Pat. No. 5,932,022 relates to a multi-step process for producing a silicon wafer with a hydrophilic oxide surface layer. The multi-step process, apart from rinsing and drying layers, involves a first application of an oxidizing solution ($NH_4O: H_2O_2: H_2O$), followed by the application of an aqueous solution containing hydrofluoric acid (HF) and hydrochloric acid (HCl), followed by a final application of an oxidizing solution (containing both $H_2O_2$ and HCl). The treatment with HF and HCl thus produces an intermediate hydrophobic surface, prior to formation of the final hydrophilic oxide-bearing surface. U.S. Pat. No. 5,932,022 teaches that HCl enables removal of metals from the surface through the formation of soluble metal complexes. The use of megasonic waves during the treatment of the surface with the first oxidizing solution ($NH_4O: H_2O_2: H_2O$) is exemplified in U.S. Pat. No. 5,932,022.

U.S. Pat. No. 5,051,134 discloses the use of cyclodextrins to reduce particle contamination of semiconductor surfaces such as silicon wafers during treatment by hydrofluoric acid-containing aqueous solutions.

A number of prior art cleaning processes for cleaning semiconductor surfaces are thus known, but the above-mentioned references either do not address the specific issue of watermarks, are not related to providing hydrophobic surfaces as final products, in particular for further epitaxial growth, or require further mandatory components in the cleaning compositions to achieve a technical effect. Megasonic waves have been disclosed in some of the above-mentioned in some cleaning processes, but not in relation to watermarks nor in the framework of HF-based treatment stages giving rise to hydrophobic surfaces, as opposed to oxidizing treatment stages giving rise to hydrophilic surfaces.

SUMMARY OF THE INVENTION

The present inventor has studied the formation of watermarks in processes of cleaning and preparing a hydrophobic surface of a semiconductor substrate in the framework of treatment with aqueous hydrofluoric acid solutions so as to prepare a semiconductor substrate suitable for use as a base substrate for epitaxial growth.

It has surprisingly been found that watermark formation may be reduced by the application of megasonic waves during the rinsing with deionized water following treatment with an aqueous hydrofluoric acid solution.

Thus, in a first aspect, the present invention is directed to a process of cleaning and preparing a hydrophobic surface of a semiconductor substrate in such a way as to suppress the appearance of watermarks, wherein the said semiconductor substrate is suitable for use as a base substrate for epitaxial growth, wherein said process of cleaning and preparing a hydrophobic surface comprises the steps of:

(a) cleaning the said substrate with an aqueous solution containing hydrofluoric acid (HF); and then (b) rinsing the said substrate with deionised water whilst, during performing of the rinsing, the said substrate is subjected to megasonic waves.

It has also, equally within the same research effort directed to reducing watermarks, now been discovered that by diluting the aqueous hydrofluoric acid solution in the HF-last procedure with an appropriate concentration of a second, strong acid, watermark formation may surprisingly be reduced.

Thus, in a second aspect, the present invention is directed to a process of cleaning and preparing a hydrophobic surface of a semiconductor substrate in such a way as to suppress the appearance of watermarks, wherein the said semiconductor substrate is suitable for use as a base substrate for epitaxial growth, wherein said process of cleaning and preparing a hydrophobic surface comprises the steps of:

(a) cleaning the said substrate with an aqueous solution containing hydrofluoric acid (HF) in addition to a strong acid with a pKa of less than 3, wherein the concentration of the said strong acid by weight used in the said aqueous solution is less than the concentration of hydrofluoric acid (HF) by weight;

(b) rinsing the said substrate with deionised water; and (c) drying the said substrate.

It may be noted that it is possible to combine both aspects of the present invention, combining both the use of megasonic waves and the use of a second strong acid, to reduce watermarks in the context of HF-based treatment of semiconductor substrates to produce hydrophobic final surfaces.

The present invention further relates to a process for adding an epitaxial layer to the surface of a substrate comprising:

α) step(s) of cleaning and preparing a surface layer of the substrate as initially present by a process involving an aqueous solution containing hydrofluoric acid (HF), the process being one of the processes according to the above-described first and/or second aspect(s) of the present invention; and β) carrying out epitaxial growth on the thus cleaned and prepared surface.

Finally, the present invention further relates to a cleaned and prepared substrate as obtained according to the above-described first and/or second aspect(s) of the present invention. The present invention also relates to a substrate having a surface layer obtained by epitaxial growth on such a cleaned and prepared substrate.

The solutions proposed by the first and second aspects of the present invention enable oxide to be removed whilst maintaining a hydrophobic surface for epitaxial growth.

This approach is distinct from the bake in a hydrogen atmosphere currently known to the skilled person for improving HF-last procedure, as well as modifications to rinsing and drying procedures, for example by replacing oxygen by nitrogen, or varying drying times.

It may also be noted that the solutions proposed by the first and second aspects of the present invention relate to the preparation of a final hydrophobic surface, rather than the preparation of hydrophilic oxide surfaces, wherein the HF-treated hydrophobic surface is a mere transient intermediate. Such a process is disclosed in US 2007/0256705 or U.S. Pat. No. 5,932,022. In effect, the HF-treated hydrophobic surfaces are prepared in the present invention with a view to being able to further grow the surfaces by epitaxy, without a further cleaning step, and obtain a high quality of final substrate. In preferred embodiments of the present invention, therefore, the cleaning and preparing processes are not followed by any treatments of the surfaces thus obtained with oxidizing agents such as hydrogen peroxide, ozone etc. so as to produce a hydrophilic surface.

The solutions proposed by the first and second aspects of the present invention also do not require the mandatory addition of a further organic additive to the cleaning solution, such as the organic ring molecules and more specifically cyclodextrins that are taught by U.S. Pat. No. 5,051,134.

DETAILED DESCRIPTION OF THE INVENTION

Figure 1:
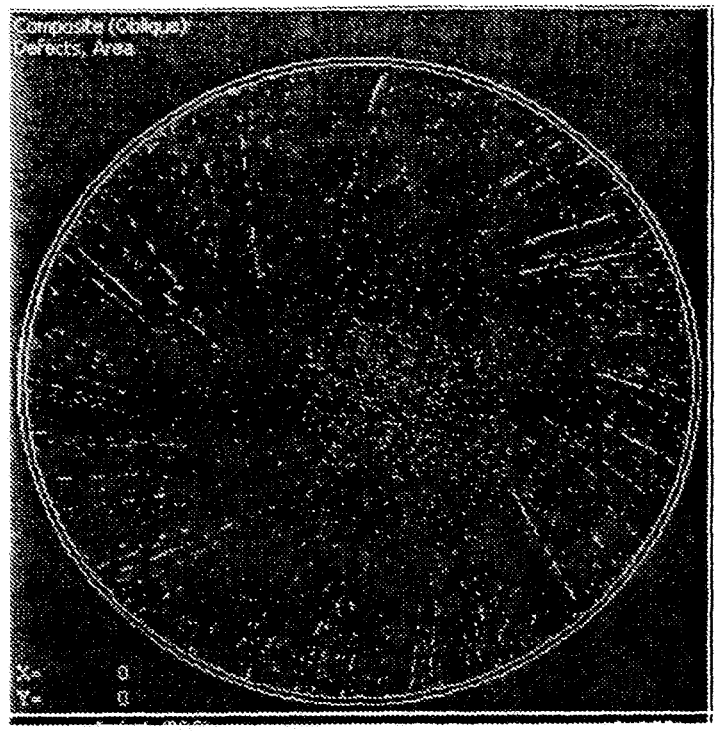
FIG. 1 shows the test results obtained for a treatment of a sSOI substrate treated by the HF solution but not subjected to meagasonic waves according to the invention.

In preferred embodiments according to the first or second aspect of the present invention, the substrate to be cleaned contains a surface layer of silicon, strained silicon or silicon-germanium.

Also, in preferred embodiments according to the first or second aspect of the present invention, the concentration of hydrofluoric acid (HF) used in the aqueous solution of step (a) is comprised in the range of 0.05%<[HF] by weight<49%, preferably 0.5%<[HF] by weight<10%. It is to be noted that the concentration here refers to the absolute concentration of HF in water ($H_2O$) on a HF:$H_2O$ weight:weight basis. 49% HF by weight would thus correspond to the application, undiluted, of the standard 49% aqueous HF marketed for use in microelectronics. A concentration of 4.9% by weight of HF is obtained by mixing one part by weight of the standard commercial 49% aqueous HF with nine parts by weight of deionized water.

With respect to the first aspect of the present invention, relating to the simultaneous use of megasonic waves along with rinsing with deionized water in the framework of treatment with an aqueous HF solution to produce a hydrophobic surface, after step (a), involving application of the HF solution, and prior to step (b) involving rinsing whilst subjecting the substrate to megasonic waves, the said substrate may optionally be rinsed, in a separate step (b0), with deionised water without the application of megasonic waves.

In the first aspect of the present invention, it is preferred, subsequent to the rinsing step (b), to dry the said substrate in a step (c). Drying can be carried out by gas flow, for example using an inert gas, or by simple spinning, as will be detailed further below.

In the first aspect of the present invention, during the application of megasonic waves during step (b) of the cleaning process, it is preferred that the megasonic wave power applied lies in the range of at least 100 Watts and at most 1200 Watts, preferably in the range of at least 800 Watts and at most 1000 Watts. The preferred values for the megasonic wave frequency applied lie in the range of at least 1 kHz and at most 10 MHz, preferably in the range of at least 700 kHz and at most 1 MHz. The preferred values for the duration of application of megasonic waves lies in the range of at least 1 second and at most 5 minutes, and preferably at least 10 seconds and at most 60 seconds.

As mentioned above, the second aspect of the present invention relates, in the framework of treatment with an aqueous HF solution to produce a hydrophobic surface, to a process of cleaning a semiconductor substrate with an aqueous solution containing hydrofluoric acid (HF) in addition to a strong acid with a pKa of less than 3, wherein the concentration of the said strong acid by weight used in the said aqueous solution is less than the concentration of hydrofluoric acid (HF) by weight.

In a preferred embodiment of the second aspect of the present invention, the strong acid used in the aqueous solution of step (a) of the above-described process of the second aspect of the present invention, in combination with hydrofluoric acid (HF), has a pKa of less than 0. This strong acid is most preferably selected from the group consisting of: hydrochloric acid (HCl), nitric acid ($HNO_3$), sulphuric acid ($H_2SO_4$) and perchloric acid ($HClO_4$). The presently most preferred strong acid in this group is hydrochloric acid (HCl). In the preferred embodiment using hydrochloric acid (HCl), the concentration of hydrochloric acid (HCl) used in the aqueous cleaning solution is in the range of 0.01%<[HCl] by weight<38%, bearing in mind that the concentration of HCl by weight will be less than that of HF by weight. It is to be noted that the concentration of HCl here is the absolute concentration of HCl in $H_2O$ in a HCl:$H_2O$ weight:weight basis, which may not in any event exceed the 38% by weight concentration of standard commercial HCl. The use of 1 part by weight of 38% by weight commercial HCl, in combination with 2 parts by weight of 49% by weight commercial HF, and 37 parts by weight of deionized water, as an example, would give a final solution having 0.95% by weight of HCl, and 2.45% by weight of HF.

In the present invention according to the first or second aspect, the use of further additives in the HF-containing cleaning solutions applied in step (a) is possible but not essential. In a currently preferred embodiment, no organic ring molecules and more specifically cyclodextrins are added to the HF-containing cleaning solutions.

In the present invention according to the first or second aspect, the temperature of the cleaning processes is not currently believed in any way to be critical. It is envisaged that temperatures of 10° C. to 90° C. could be used for the cleaning process, more preferably 15° C. to 60° C., and most preferably around 20° C. or standard ambient temperatures in semiconductor manufacturing practice.

As regards the drying conditions in the present invention (step (c) in the process according to either the first or second aspect of the present invention), different systems may be envisaged, such as drying by gas flow, in particular using a flow of inert gas such as nitrogen or argon, or simple spinning to induce evaporation. In some cases, for example with more hydrophobic surfaces, the use of IPA (isopropyl alcohol)-based drying techniques, using surface tension gradients, advantageously combined with drying by inert gas flow, can be employed. A spin-dry process is a currently preferred embodiment of the invention. The duration of a spin-dry step (c) is typically comprised within the range of 30 seconds to 5 minutes.

As regards the duration of the cleaning process, it is envisaged that treatment times of between 1 second and 5 minutes could be used in cleaning step (a) of the process according to either the first or second aspect of the present invention. Currently preferred cleaning times are comprised between 5 seconds and 40 seconds.

Concerning rinsing step (b), it is envisaged that rinsing times of between 1 second and 5 minutes could be used in processes according to either the first or second aspects of the present invention, and currently preferred rinsing times are comprised between 5 seconds and 40 seconds. In the first aspect of the present invention, as described above, the duration of application of megasonic waves preferably lies in the range of at least 1 second and at most 5 minutes, and preferably at least 10 seconds and at most 60 seconds, it being understood that megasonic waves are only applied during rinsing.

In either the first or second aspects of the present invention, in a preferred embodiment, a single wafer cleaning device is used.

As mentioned previously, the present invention further relates to a process for adding an epitaxial layer to the surface of a substrate comprising:

α) step(s) of cleaning and preparing a surface layer of the substrate as initially present by a process involving cleaning the surface layer with an aqueous solution containing hydrofluoric acid (HF) according to the first or second aspect of the present invention; and β) carrying out epitaxial growth on the cleaned and prepared surface.

Epitaxy is a well-known process for the skilled person in the field of manufacture of silicon-based semiconductor wafer products. Vapor phase epitaxy (a form of chemical vapor deposition) can be used to produce crystalline growth on seed surfaces. In common vapor-phase processes, use is made of a high temperature (over 1000° C.) equilibrium between a gas phase halide or hydride of, for example, silicon, and the solid material to be laid down in an epitaxial layer (for example, elemental silicon). Hydride vapor phase epitaxy (HVPE) can be used for epitaxial growth processes to be applied to cleaned substrates according to the present invention.

EXAMPLES

In a non-limiting illustration of embodiments according to the second aspect of the present invention, a bulk silicon substrate was cleaned with a variety of HCl/HF mixtures as set out in the following Table 1. The drying conditions used involved drying by rotation (SpinDry) à 2200 RPM during 1 min.

The surfaces obtained were analysed by SP1 (by light scattering). So-called "watermarks" consist in a series of surface flaws showing up as a succession of points on the photos starting from the center to the edge of the wafer to form a linear line. Where lines of surface flaws were observed, the presence of watermarks is indicated by a "Yes" in the corresponding column of the Table 1.

TABLE 1

Effect on watermarks of treatment with mixtures of HF and HCl

| [HF] % (by weight) | [HCl] % (by weight) | Time of treatment with HF-HCl mixture (s) | Rinsing time with deionised water (s) | Presence of watermarks (Yes/No) |
|---|---|---|---|---|
| 1.5 | 1 | 10 | 10 | No |
| 1.5 | 0 | 10 | 10 | Yes |
| 1.5 | 1 | 10 | 25 | No |
| 1.5 | 0 | 10 | 25 | Yes |
| 1.5 | 1 | 35 | 10 | No |
| 0.5 | 0 | 35 | 25 | Yes |
| 0.5 | 1 | 35 | 25 | Yes |

Figure 2:
FIG. 2 shows the test results obtained for a treatment of a sSOI substrate treated by the same HF solution and then by megasonic waves applied with a power of 1000 W, a frequency of 1 MHz and a time of application of 42 seconds.

Similarly, in a non-limiting illustration of embodiments according to the first aspect of the present invention, a strained-silicon-on-insulator (sSOI) substrate was cleaned with an HF solution at a concentration of 1.5% by weight, without any added HCl. The time of treatment with HF was 10 seconds, and the time of rinsing with deionized water with concurrent exposure to megasonic waves was 25 seconds. In the test according to the first aspect of the present invention, the results obtained for which are shown in attached FIG. 2, megasonic waves were applied with a power of 1000 W, a frequency of 1 MHz and a time of application of 42 seconds. As shown in attached FIG. 2, through SP1 observation only 220 defects at 0.40 μm were observed, and no watermarks. By contrast, the same sSOI substrate, treated by the same HF solution but not subsequently subjected to megasonic waves, showed 2500 defects at 0.40 μm and watermarks were visible, as shown in attached FIG. 1.

What is claimed is:

1. A process for reducing or suppressing the appearance of watermarks in a hydrophobic surface of a semiconductor substrate prepared as a base substrate for epitaxial growth, which process comprises:

cleaning the hydrophobic surface of the semiconductor substrate with an aqueous solution containing hydrofluoric acid (HF) and an additional acid having a pKa of less than 3, wherein the additional acid is present in the solution at a concentration by weight that is less than that of the HF; and final rinsing the cleaned hydrophobic surface of the semiconductor substrate with deionised water while subjecting the hydrophobic surface of the semiconductor substrate to megasonic waves for a time sufficient to reduce or suppress watermarks that could otherwise occur on the hydrophobic surface if the megasonic waves were not applied.

2. The process of claim 1, which further comprises conducting an additional rinsing with deionised water without the application of megasonic waves immediately after the cleaning and prior to the final rinsing.

3. The process of claim 1, which further comprises drying the substrate after the final rinsing.

4. The process of claim 1, wherein the megasonic waves are applied at a power in the range of at least 100 Watts and at most 1200 Watts, at a frequency of at least 1 kHz and at most 10 MHz and for a time in the range of at least 1 second and at most 5 minutes.

5. The process of claim 1, wherein the megasonic waves are applied at a power in the range of at least 800 Watts and at most 1000 Watts, at a frequency in the range of at least 700 kHz and at most 1 MHz, and for a time in the range of at least 10 seconds and at most 60 seconds.

6. The process of claim 1, wherein HF is present in the solution at a concentration in the range of 0.05% <[HF] by weight<49%.

7. The process of claim 1, wherein HF is present in the solution at a concentration in the range of 0.5% <[HF] by weight<10%.

8. The process of claim 1, wherein the additional acid has a pKa of less than 0 and the cleaning removes surface oxides and provides a hydrophobic surface for epitaxial growth.

9. The process of claim 8, wherein the additional acid is selected from the group consisting of hydrochloric acid (HCl), nitric acid (HNO3), sulphuric acid (H2SO4) and perchloric acid (HClO4).

10. The process of claim 8, wherein the additional acid is hydrochloric acid (HCl) and is present at a concentration in the range of 0.01% <[HCl] by weight<38%.

11. The process of claim 8, wherein the additional acid is hydrochloric acid (HCl) and is present at a concentration in the range of 0.01% <[HCl] by weight<5%.

12. The process of claim 1, wherein the hydrophobic surface is of the substrate is provided by a layer of silicon, strained silicon or silicon-germanium.

13. The process of claim 1, wherein the hydrophobic surface is of the substrate is provided by a layer of silicon-germanium.

14. The process of claim 1, wherein the cleaning is carried out in a single wafer cleaning device and is directly followed by the final rinsing.

15. The process of claim 1, which further comprises carrying out epitaxial growth on the cleaned and prepared hydrophobic surface of the semiconductor substrate.

16. The process of claim 15, wherein the hydrophobic surface of the substrate is provided by a layer of silicon-germanium (SiGe) layer or a strained silicon (sSi) layer.

17. The process of claim 15, wherein the hydrophobic surface of the substrate is provided by a layer of silicon-germanium (SiGe) layer having a germanium concentration of at least 20%, expressed as a percentage of Ge atoms with respect to Si atoms, at the surface of the substrate.

18. The process of claim 15, wherein the epitaxial growth comprises growth of a strained silicon (sSi) layer or a silicon-germanium (SiGe) layer on the hydrophobic surface of the semiconductor substrate.

19. A process for reducing or suppressing the appearance of watermarks in a hydrophobic surface of a semiconductor substrate prepared as a base substrate for epitaxial growth, which process comprises:

cleaning the hydrophobic surface of the semiconductor substrate with an aqueous solution containing hydrofluoric acid (HF) and hydrochloric acid (HCl), wherein the HF is present in the solution at a concentration in the range of 0.5% <[HF] by weight<49% and the HCl is present at a concentration in the range of 0.01% <[HCl] by weight<38% with the HCl present in the solution at a concentration by weight that is less than that of the HF; and final rinsing the cleaned hydrophobic surface of the semiconductor substrate with deionised water while subjecting the hydrophobic surface of the semiconductor substrate to megasonic waves for a time sufficient to reduce or suppress watermarks that could otherwise occur on the hydrophobic surface if the megasonic waves were not applied;

wherein the megasonic waves are applied at a power in the range of at least 100 Watts and at most 1200 Watts, at a frequency of at least 1 kHz and at most 10 MHz and for a time in the range of at least 1 second and at most 5 minutes.

20. The process of claim 19 wherein the HF is present in the solution at a concentration in the range of 0.5% <[HF] by weight<10% and the HCl is present at a concentration in the range of 0.01% <[HCl] by weight<5%, and wherein the megasonic waves are applied at a power in the range of at least 800 Watts and at most 1000 Watts, at a frequency in the range of at least 700 kHz and at most 1 MHz, and for a time in the range of at least 10 seconds and at most 60 seconds.

* * * * *